US010931261B2

(12) United States Patent
Kato et al.

(10) Patent No.: US 10,931,261 B2
(45) Date of Patent: Feb. 23, 2021

(54) FILTER AND MULTIPLEXER

(71) Applicant: Murata Manufacturing Co., Ltd., Nagaokakyo (JP)

(72) Inventors: Masanori Kato, Nagaokakyo (JP);
Minoru Iwanaga, Nagaokakyo (JP);
Hiroshi Matsubara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 50 days.

(21) Appl. No.: 16/413,705

(22) Filed: May 16, 2019

(65) Prior Publication Data

US 2020/0007106 A1 Jan. 2, 2020

(30) Foreign Application Priority Data

Jun. 29, 2018 (JP) .............................. JP2018-124275

(51) Int. Cl.
| H03H 9/54 | (2006.01) |
| H03H 9/72 | (2006.01) |
| H03H 7/46 | (2006.01) |
| H03H 7/01 | (2006.01) |
| H03H 9/00 | (2006.01) |

(Continued)

(52) U.S. Cl.
CPC ............ H03H 9/54 (2013.01); H03H 7/0161 (2013.01); H03H 7/463 (2013.01); H03H 9/0004 (2013.01); H03H 9/542 (2013.01); H03H 9/64 (2013.01); H03H 9/706 (2013.01); H03H 9/725 (2013.01)

(58) Field of Classification Search
CPC ........ H03H 7/463; H03H 7/0161; H03H 9/54; H03H 9/0004; H03H 9/542; H03H 9/706; H03H 9/64; H03H 9/725; H04J 1/02

USPC .......................... 333/133, 187, 188, 193–196
See application file for complete search history.

(56) References Cited

U.S. PATENT DOCUMENTS

| 2006/0202778 A1* | 9/2006 | Morris, III | ............... H01G 5/18 333/132 |
| 2013/0328640 A1* | 12/2013 | Tsutsumi | ............... H03H 9/706 333/133 |

(Continued)

FOREIGN PATENT DOCUMENTS

| JP | 2000-151356 A | 5/2000 |
| JP | 2006-086871 A | 3/2006 |

(Continued)

OTHER PUBLICATIONS

Official Communication issued in corresponding Korean Patent Application No. 10-2019-0055458, dated Jul. 22, 2020.

*Primary Examiner* — Robert J Pascal
*Assistant Examiner* — Jorge L Salazar, Jr.

(57) ABSTRACT

A filter includes a resonant circuit defining at least a portion of a signal path connected between a first terminal and a second terminal, an elastic wave resonator including one end that is grounded, a first inductor including one end connected to one end of the resonant circuit and another end connected to another end of the elastic wave resonator, and a second inductor including one end connected to another end of the resonant circuit and another end connected to the other end of the elastic wave resonator. The resonant circuit is an LC series resonant circuit in which a third inductor and first and second capacitors are connected in series with each other.

17 Claims, 7 Drawing Sheets

(51) Int. Cl.
*H03H 9/70* (2006.01)
*H03H 9/64* (2006.01)

(56) References Cited

U.S. PATENT DOCUMENTS

| | | | |
|---|---|---|---|
| 2015/0288346 A1* | 10/2015 | Nakamura | H01L 41/047 |
| | | | 333/133 |
| 2016/0191014 A1 | 6/2016 | Khlat et al. | |
| 2017/0005639 A1 | 1/2017 | Khlat et al. | |
| 2017/0093370 A1* | 3/2017 | Khlat | H03H 9/0004 |
| 2017/0134005 A1 | 5/2017 | Takeuchi et al. | |

FOREIGN PATENT DOCUMENTS

| | | |
|---|---|---|
| KR | 10-2017-0024342 A | 3/2017 |
| WO | 2016/013659 A1 | 1/2016 |

\* cited by examiner

FIG. 6A (a) REFLECTION CHARACTERISTIC

(b) BANDPASS CHARACTERISTIC

FIG. 6B (a) REFLECTION CHARACTERISTIC

(b) BANDPASS CHARACTERISTIC

FIG. 6C (a) REFLECTION CHARACTERISTIC

(b) BANDPASS CHARACTERISTIC

FIG. 7

FIG. 8  P1-P2 BANDPASS CHARACTERISTIC

FIG. 9  RESONANCE CHARACTERISTIC

FIG. 10A (a) REFLECTION CHARACTERISTIC (b) BANDPASS CHARACTERISTIC

FIG. 10B (a) REFLECTION CHARACTERISTIC (b) BANDPASS CHARACTERISTIC

FIG. 10C (a) REFLECTION CHARACTERISTIC (b) BANDPASS CHARACTERISTIC

FIG. 11

LB:617MHz-960MHz
MB:1427MHz-2200MHz
HB:2300MHz-2690MHz

FIG. 12    BANDPASS CHARACTERISTIC

FILTER AND MULTIPLEXER

CROSS REFERENCE TO RELATED APPLICATIONS

This application claims the benefit of priority to Japanese Patent Application No. 2018-124275 filed on Jun. 29, 2018. The entire contents of this application are hereby incorporated herein by reference.

BACKGROUND OF THE INVENTION

1. Field of the Invention

The present invention relates to a filter and a multiplexer.

2. Description of the Related Art

There are communication devices that support a plurality of frequency bands (multi-band) and a plurality of wireless methods (multi-mode). A multiplexer that multiplexes and demultiplexes signals of a plurality of frequency bands is used in a front end circuit of such a communication device. A multiplexer is formed of a plurality of filters having different pass bands from each other, for example.

U.S. Patent Application Publication No. 2016/0191014 discloses a high-frequency circuit that is effectively used as a band pass filter.

Figure 14:
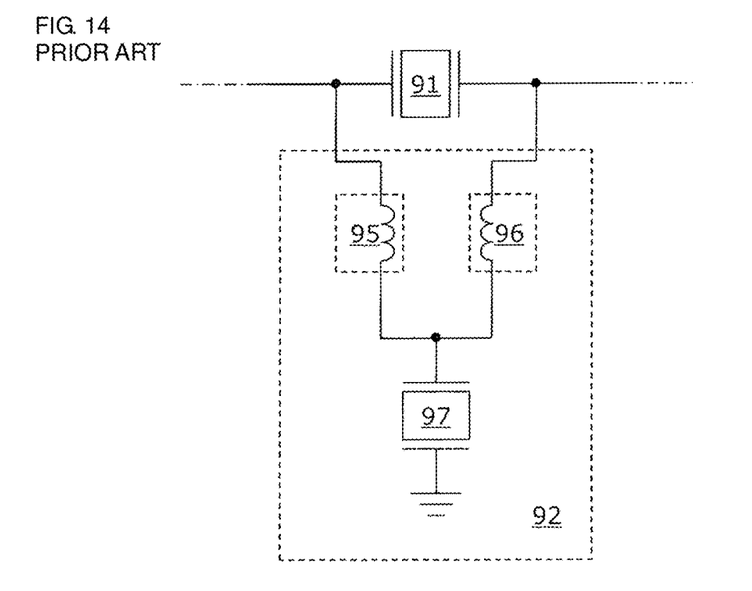
FIG. 14 is a circuit diagram illustrating an example of a high-frequency circuit of the related art.

FIG. 14 is a circuit diagram illustrating an example of a high-frequency circuit disclosed in U.S. Patent Application Publication No. 2016/0191014. The reference symbols used in FIG. 14 have been appropriately changed from the reference symbols used in U.S. Patent Application Publication No. 2016/0191014.

The high-frequency circuit illustrated in FIG. 14 includes an elastic wave resonator 91 and a parallel capacitance compensation circuit 92. The parallel capacitance compensation circuit 92 includes inductors 95 and 96 and an elastic wave resonator 97.

Recently, with the opening up of new frequency bands and the increasingly narrow gaps between frequency bands, there is a demand for the filters of multiplexers to have a wide pass band, a small insertion loss, and a steep attenuation characteristic at an end of the pass band.

SUMMARY OF THE INVENTION

Preferred embodiments of the present invention provide filters each having a wide pass band, a small insertion loss, and a steep attenuation characteristic at an end of the pass band, and multiplexers in which such filters are included.

A filter according to a preferred embodiment of the present invention includes a series arm resonant circuit that defines at least a portion of a signal path connected between a first terminal and a second terminal; a parallel arm resonator including one end that is grounded; a first inductor including one end that is connected to one end of the series arm resonant circuit and another end that is connected to another end of the parallel arm resonator; and a second inductor including one end that is connected to another end of the series arm resonant circuit and another end that is connected to the another end of the parallel arm resonator. The series arm resonant circuit is an LC series resonant circuit in which a third inductor and a capacitor are connected in series with each other.

With the filter according to the preferred embodiment of the present invention described above, by making use of the fact that the LC series resonant circuit defining the series arm resonant circuit does not include an anti-resonant frequency and the fact that changes in the resonance characteristic of the LC series resonant circuit are gentle compared with an elastic wave resonator, matching inside a wide pass band is able to be improved and the insertion loss of the filter is able to be reduced. Furthermore, a steep attenuation characteristic is able to be provided at an end of the pass band by utilizing the frequency characteristic of the parallel arm resonator in which the impedance falls sharply in the vicinity of the resonant frequency. As a result, a filter is obtained that has a wide pass band, a small insertion loss, and a steep attenuation characteristic at an end of the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings. The preferred embodiments described hereafter each illustrate a comprehensive or specific example of the present invention. The numerical values, shapes, materials, elements, arrangement of the elements, the ways in which the elements are connected to each other, and other features and elements described in the following preferred embodiments are merely examples and are not intended to limit the scope of the present invention.

Preferred Embodiment 1

A filter according to a preferred embodiment 1 of the present invention will be described with reference to the example of a filter included in a multiplexer.

Figure 1:
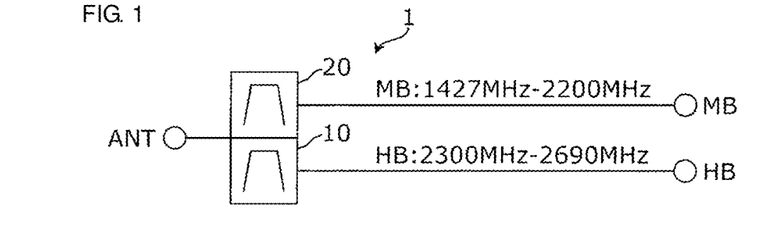
FIG. 1 is a block diagram illustrating an example of the configuration of a multiplexer in which a filter according to a preferred embodiment 1 of the present invention is included.

FIG. 1 is a block diagram illustrating an example of the configuration of a multiplexer in which the filter according to the preferred embodiment 1 is included. As illustrated in FIG. 1, a multiplexer 1 includes a filter 10 that includes a first frequency band as a pass band and a filter 20 that includes a second frequency band as a pass band. The multiplexer 1 is a diplexer that multiplexes and demultiplexes a signal of the first frequency band and a signal of the second frequency band.

In FIG. 1, as an example, the first frequency band is preferably from about 2300 MHz to about 2690 MHz and the second frequency band is from about 1427 MHz to about 2200 MHz. In this specification, for convenience, the frequency band from about 2300 MHz to about 2690 MHz will be referred to as a high band HB and the frequency band from about 1427 MHz to about 2200 MHz will be referred to as a middle band MB.

One end of the filter 10 and one end of the filter 20 are connected to an antenna terminal ANT. The other end of the filter 10 is connected to a high band terminal HB and the other end of the filter 20 is connected to a middle band terminal MB.

In the case in which the filters 10 and 20 each sufficiently reduce or prevent a signal of the other pass band, a signal of the high band HB and a signal of the middle band MB respectively selected by the filters 10 and 20 are able to be simultaneously handled without interference therebetween using one antenna connected to the antenna terminal ANT. That is, carrier aggregation (CA) is able to be performed between a communication band belonging to the high band HB and a communication band belonging to the middle band MB using one antenna.

For example, the following bandpass characteristic is preferable for the filter 10 in order to achieve carrier aggregation.

Figure 2:
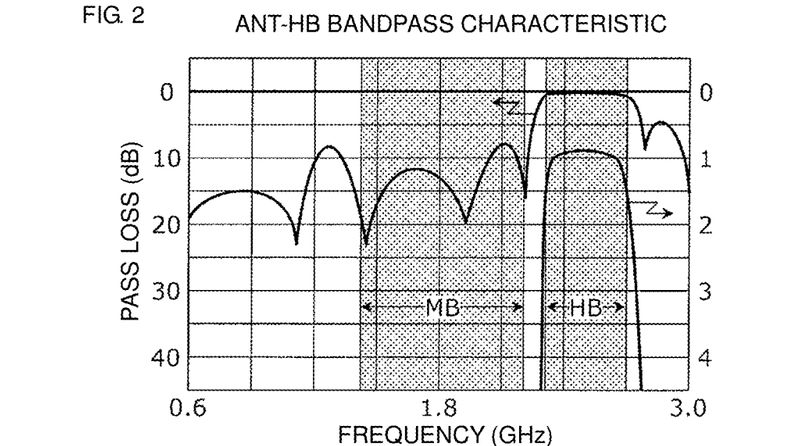
FIG. 2 is a graph for describing the bandpass characteristic obtained by the filter according to the preferred embodiment 1 of the present invention.

FIG. 2 is a graph for describing an example of the preferred bandpass characteristic for the filter 10 (more precisely, the bandpass characteristic between antenna terminal and high band terminal of multiplexer 1). As illustrated in FIG. 2, for the filter 10, a demultiplexing performance that includes a wide pass band (high band HB with relative band width of about 15% or more, for example), a wide attenuation band (middle band MB with relative band width of about 40% or more, for example), and a narrow frequency gap of about 100 MHz, for example, (relative band width of about 4%, for example) between the attenuation band and the pass band. Here, the relative bandwidth of a band refers to the ratio between the difference between the upper end and the lower end of the band and the center frequency of the band.

The inventors of preferred embodiments of the present invention performed an investigation into achieving a filter including such a pass band using the high-frequency circuit of the related art. Hereafter, the results of the investigation will be described as a comparative example.

Figure 3:
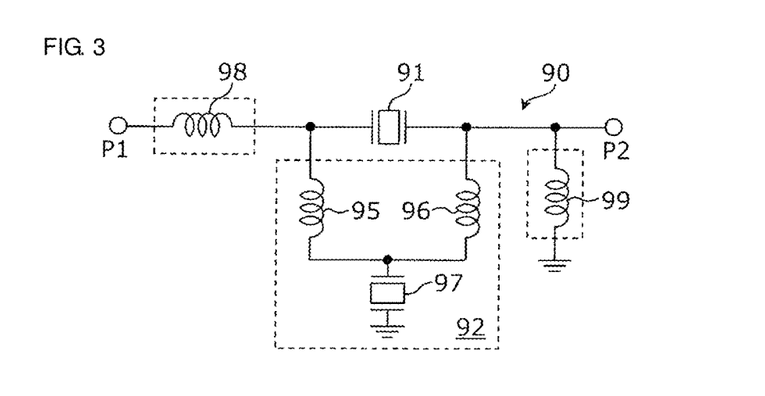
FIG. 3 is a circuit diagram illustrating an example of the configuration of a filter according to a comparative example.

FIG. 3 is a circuit diagram illustrating an example of the configuration of a filter 90 according to a comparative example. As illustrated in FIG. 3, the filter 90 includes matching inductors 98 and 99 that are added to the high-frequency circuit illustrated in FIG. 14, which includes the elastic wave resonator 91 and the parallel capacitance compensation circuit 92. The parallel capacitance compensation circuit 92 includes the inductors 95 and 96 and the elastic wave resonator 97.

Figure 4:
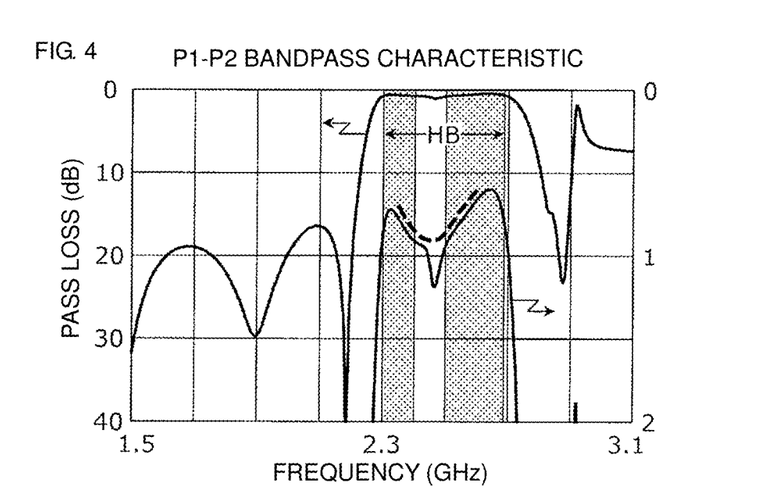
FIG. 4 is a graph illustrating an example of a bandpass characteristic of the filter according to the comparative example.

FIG. 4 is a graph illustrating an example of the bandpass characteristic of the filter 90 between terminals P1 and P2. The pass band of the filter 90 was set so as to be divided into a first portion from about 2300 MHz to about 2400 MHz and a second portion from about 2496 MHz to about 2690 MHz as portions of the high band HB in which communication bands that are to be actually used are located (portions that are shaded gray in FIG. 4). An enlarged waveform of the high band HB portion is illustrated.

As indicated by the broken line extending along the enlarged waveform in FIG. 4, it is clear that the bandpass characteristic of the filter 90 has a large concave waveform inside the high band HB and that insertion loss in the center of the high band HB is large. In addition, the notch that is seen between the first portion and the second portion arises from an unwanted wave caused by the elastic wave resonator 97 and is intentionally disposed outside the pass band.

Figure 5:
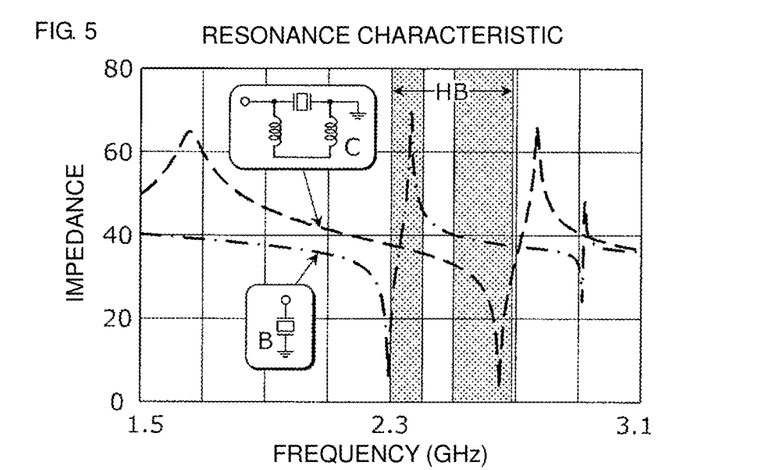
FIG. 5 is a graph illustrating an example of the resonance characteristics of partial circuits of the filter according to the comparative example.

FIG. 5 is a graph illustrating an example of resonance characteristics of partial circuits of the filter 90. FIG. 5 illustrates the respective impedance-frequency characteristics of a partial circuit B including the elastic wave resonator 97 and a partial circuit C including the elastic wave resonator 91 and the inductors 95 and 96. The bandpass characteristic illustrated in FIG. 4 is defined by the combination of the impedances illustrated in FIG. 5.

The bandpass characteristic in FIG. 4 will be analyzed in more detail below.

Figure 6A:
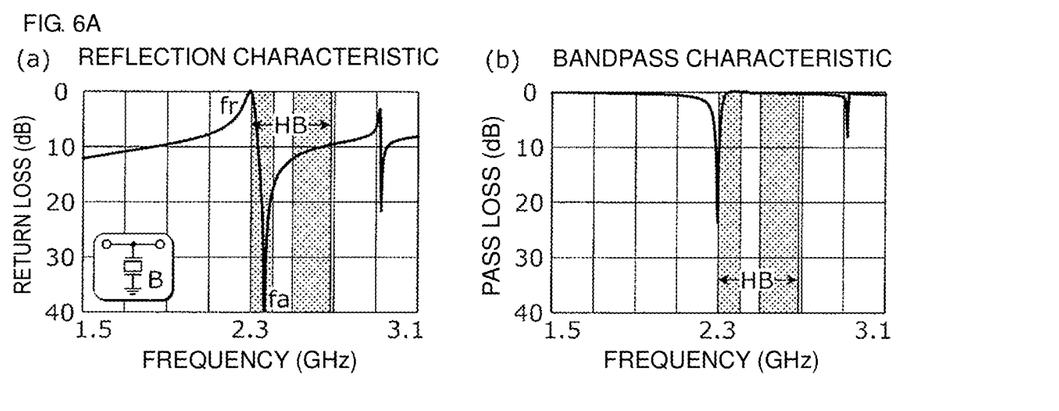
FIG. 6A is a graph illustrating an example of a reflection characteristic and a bandpass characteristic of a partial circuit of the filter circuit according to the comparative example.

FIG. 6A is a graph illustrating an example of a reflection characteristic and a bandpass characteristic of the partial circuit B (i.e., the elastic wave resonator 97) of the filter 90, where part (a) illustrates the reflection characteristic and part (b) illustrates the bandpass characteristic. The reflection characteristic and the bandpass characteristic in FIG. 6A are provided as a result of a signal flowing to ground in accordance with the impedance of the partial circuit B illustrated in FIG. 5.

Symbols fr and fa in FIG. 6A respectively indicate the resonant frequency and the anti-resonant frequency of the elastic wave resonator 97. The resonant frequency fr of the elastic wave resonator 97 is disposed at the lower end of the high band HB.

The relative band width of an elastic wave resonator is generally narrow. For example, an elastic wave resonator that includes a substrate made of a piezoelectric material containing lithium niobate and in which a signal is transmitted via Raleigh waves propagating along the substrate (hereafter, abbreviated to an LN Raleigh resonator) has a relative band width of several percent. Here, the relative band width of an elastic wave resonator refers to the ratio between the difference between the anti-resonant frequency and the resonant frequency of the elastic wave resonator and the center frequency of the elastic wave resonator.

Steep attenuation is able to be provided in the bandpass characteristic of partial circuit B at the lower end of the high band HB (part (b) of FIG. 6A) by providing the elastic wave resonator 97 using an elastic wave resonator having a narrow relative band width, such as an LN Raleigh resonator, for example.

Figure 6B:
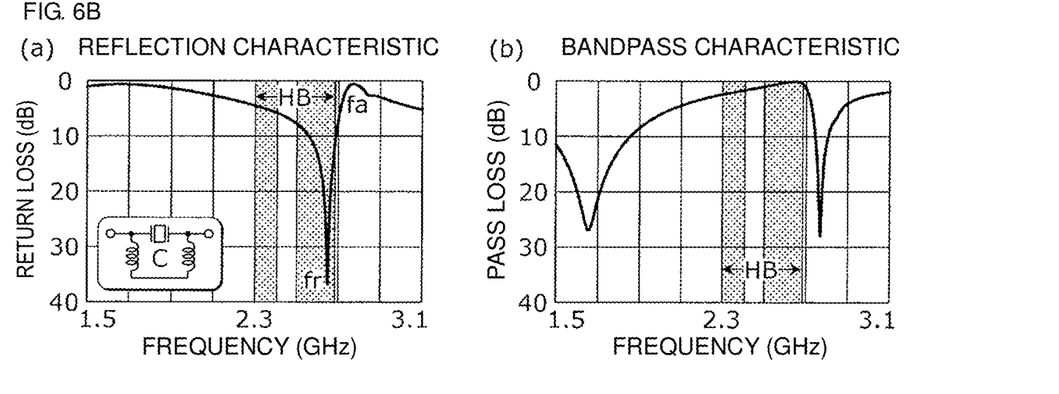
FIG. 6B is a graph illustrating an example of a reflection characteristic and a bandpass characteristic of a partial circuit of the filter circuit according to the comparative example.

FIG. 6B is a graph illustrating an example of a reflection characteristic and a bandpass characteristic of the partial circuit C of the filter 90, where part (a) illustrates the reflection characteristic and part (b) illustrates the bandpass characteristic. The reflection characteristic and the bandpass characteristic in FIG. 6B are provided as a result of the passage of a signal being reduced or prevented in accordance with the impedance of the partial circuit C illustrated in FIG. 5.

The symbols fr and fa in FIG. 6B respectively indicate the resonant frequency and the anti-resonant frequency of the partial circuit C. The anti-resonant frequency of the partial circuit C is disposed outside the band of the high band HB on the high-frequency side of the high band HB.

The relative band width of the partial circuit C is larger than the relative band width of the elastic wave resonator 91 by itself due to the presence of the inductors 95 and 96, but is substantially smaller than the relative band width of the high band HB. Therefore, the resonant frequency fr of the partial circuit C is located in a portion of the high band HB close to the upper end of the high band HB. Thus, the return loss of the partial circuit C changes steeply and by a large amount particularly in the vicinity of the resonant frequency fr inside the high band HB (part (a) in FIG. 6B).

Figure 6C:
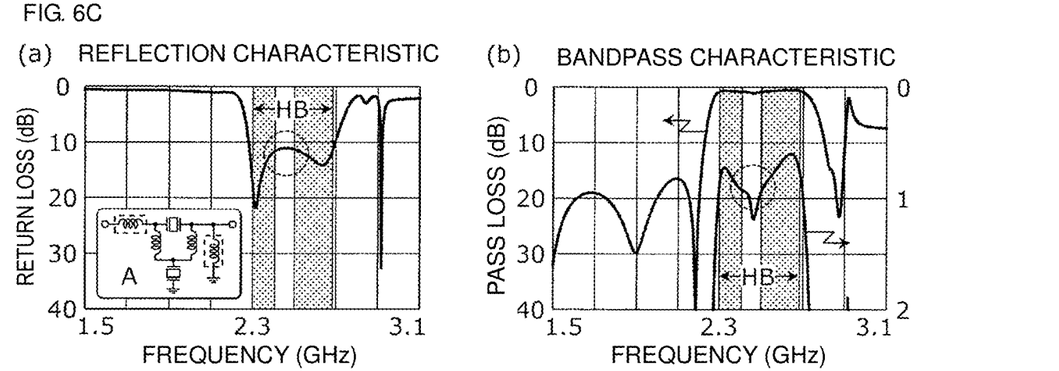
FIG. 6C is a graph illustrating an example of a reflection characteristic and a bandpass characteristic of the entire filter according to the comparative example.

FIG. 6C is a graph illustrating an example of a reflection characteristic and a bandpass characteristic of the entirety A of the filter 90, where part (a) illustrates the reflection characteristic and part (b) illustrates the bandpass characteristic. The reflection characteristic and the bandpass characteristic in FIG. 6C are provided by adding matching achieved by the inductors 98 and 99 to the combined characteristic of the partial circuits B and C in FIGS. 6A and 6B.

As can be seen from the area inside the broken line circle in part (a) of FIG. 6C, the return loss of the entirety A of the filter 90 is smaller in the center of the high band HB than at the two ends of the high band HB. In other words, reflection of a signal at an input side of the filter 90 is larger in the center of the high band HB. This is because the reflection characteristic of the partial circuit C is too steep and, therefore, satisfactory return loss cannot be secured in the center of the high band.

As a result, as can be seen inside the broken line circle in part (b) of FIG. 6C, the insertion loss of the entirety A of the filter 90 has a large concave waveform inside the high band HB and the insertion loss increases (worsens) in the center of the high band HB.

Based on this investigation, a filter is proposed in which degradation of the insertion loss is improved by reducing the steepness of the frequency characteristic of the elastic wave resonator 91 of the filter 90.

Figure 7:
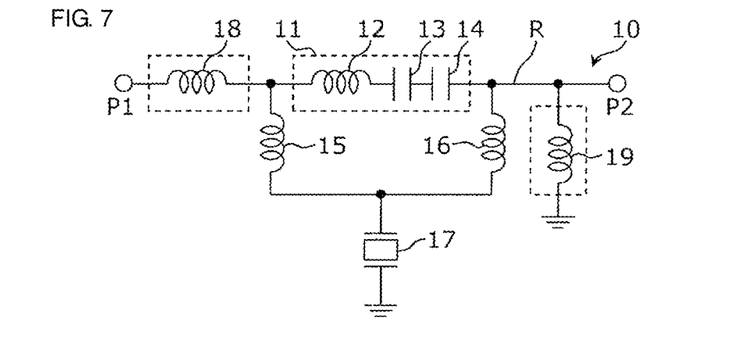
FIG. 7 is a circuit diagram illustrating an example of the configuration of a filter according to the preferred embodiment 1 of the present invention.

FIG. 7 is a circuit diagram illustrating an example of the configuration of a filter according to the preferred embodiment 1. As illustrated in FIG. 7, a filter 10 includes terminals P1 and P2, a signal path R, a resonant circuit 11, an elastic wave resonator 17, and inductors 15, 16, 18, and 19.

The resonant circuit 11 is preferably, for example, an LC series resonant circuit defined by connecting an inductor 12 and capacitors 13 and 14 in series with each other. The resonant circuit 11 defines at least a portion of the signal path R connected between the terminals P1 and P2. The terminals P1 and P2 are respectively examples of a first terminal and a second terminal. The resonant circuit 11 is an example of a series arm resonant circuit and the inductor 12 is an example of a third inductor.

One end of the elastic wave resonator 17 is connected to ground.

One end of the inductor 15 is connected to one end of the resonant circuit 11 and the other end of the inductor 15 is connected to the other end of the elastic wave resonator 17. The inductor 15 is an example of a first inductor.

One end of the inductor 16 is connected to the other end of the resonant circuit 11 and the other end of the inductor 16 is connected to the other end of the elastic wave resonator 17. The inductor 16 is an example of a second inductor.

One end of the inductor 18 is connected to the terminal P1 and the other end of the inductor 18 is connected to the one end of the resonant circuit 11. The inductor 18 is an example of a matching fourth inductor that is connected to a portion of the signal path between the series arm resonant circuit and the first terminal.

One end of the inductor 19 is connected to a portion of the signal path R between the resonant circuit 11 and the terminal P2 and the other end of the inductor 19 is connected to ground. The inductor 19 is an example of a matching fourth inductor that is connected to a portion of the signal path between the series arm resonant circuit and the second terminal.

The filter 10 is the same or substantially the same as a filter obtained by replacing the elastic wave resonator 91 in the filter 90 in FIG. 3 with the resonant circuit 11. The elastic wave resonator 17 and the inductors 15, 16, 18, and 19 of the filter 10 respectively correspond to the elastic wave resonator 97 and the inductors 95, 96, 98, and 99 of the filter 90.

Figure 8:
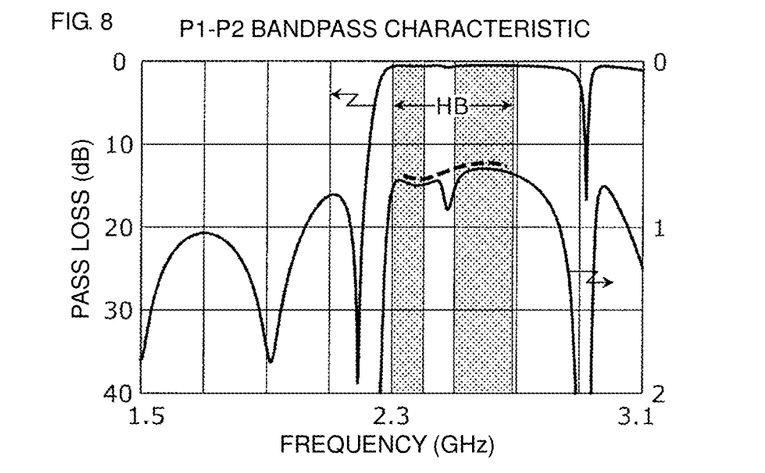
FIG. 8 is a graph illustrating an example of a bandpass characteristic of the filter according to the preferred embodiment 1 of the present invention.

FIG. 8 is a graph illustrating an example of the bandpass characteristic of the filter 10 between the terminals P1 and P2. The pass band of the filter 10 was set so as to be divided into a first portion from about 2300 MHz to about 2400 MHz and a second portion from about 2496 MHz to about 2690 MHz as portions of the high band HB in which communication bands that are to be actually used are located (shaded gray in FIG. 8). An enlarged waveform of the high band HB portion is illustrated.

As indicated by the broken line extending along the enlarged waveform in FIG. 8, it is clear that the bandpass characteristic of the filter 10 has a waveform in which the concave shape is reduced compared to FIG. 4 and that insertion loss in the center of the high band HB is reduced (improved).

Figure 9:
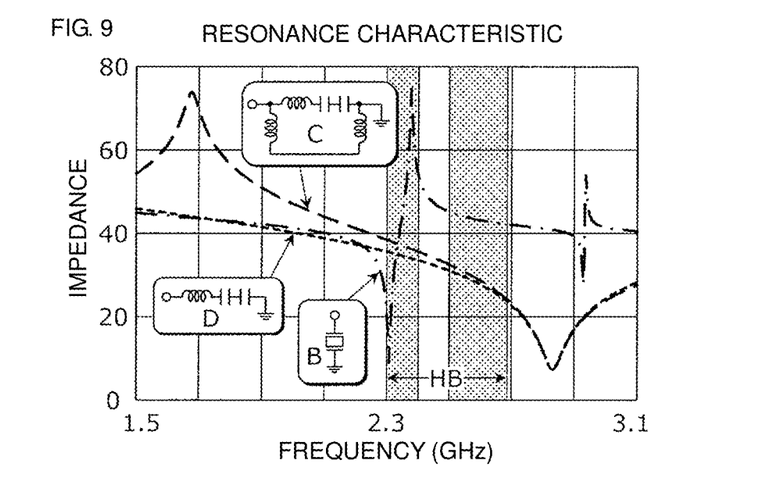
FIG. 9 is a graph illustrating an example of resonance characteristics of partial circuits of the filter according to the preferred embodiment 1 of the present invention.

FIG. 9 is a graph illustrating an example of resonance characteristics of partial circuits of the filter 10. FIG. 9 illustrates the respective impedance-frequency characteristics of a partial circuit B including the elastic wave resonator 17, a partial circuit C including of the resonant circuit 11 and the inductors 15 and 16, and a partial circuit D including the resonant circuit 11. The bandpass characteristic illustrated in FIG. 8 is defined by the combination of the impedances illustrated in FIG. 9. Here, since the resonant circuit 11 is preferably, for example, an LC series resonant circuit, care is taken to ensure that the partial circuit D does not have an anti-resonant point at which the impedance has a maximum value.

The bandpass characteristic in FIG. 8 will be analyzed in more detail below.

Figure 10A:
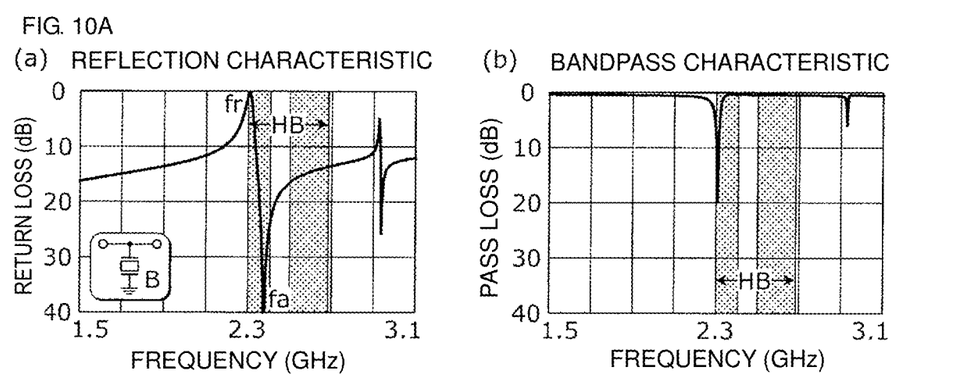
FIG. 10A is a graph illustrating an example of a reflection characteristic and a bandpass characteristic of a partial circuit of the filter according to the preferred embodiment 1 of the present invention.

FIG. 10A is a graph illustrating an example of a reflection characteristic and a bandpass characteristic of the partial circuit B (i.e., the elastic wave resonator 17) of the filter 10, where part (a) illustrates the reflection characteristic and part (b) illustrates the bandpass characteristic. Symbols fr and fa in FIG. 10A respectively indicate the resonant frequency and the anti-resonant frequency of the elastic wave resonator 17. The features of the reflection characteristic and the bandpass characteristic in FIG. 10A are the same or substantially the same as those described for the partial circuit B of the filter 90 in FIG. 6A, and, therefore, description thereof is omitted.

As described using FIG. 6A, steep attenuation is able to be provided in the bandpass characteristic of the partial circuit B at the lower end of the high band HB (part (b) of FIG. 10A) preferably by configuring the elastic wave resonator 17 to have a narrow relative band width, such as an LN Raleigh resonator, for example.

Figure 10B:
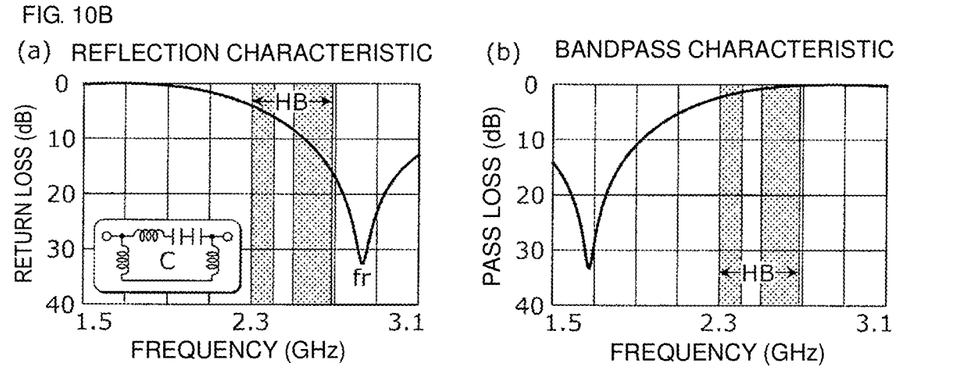
FIG. 10B is a graph illustrating an example of a reflection characteristic and a bandpass characteristic of a partial circuit of the filter according to the preferred embodiment 1 of the present invention.

FIG. 10B is a graph illustrating an example of the reflection characteristic and the bandpass characteristic of the partial circuit C of the filter 10, where part (a) illustrates the reflection characteristic and part (b) illustrates the bandpass characteristic. The symbol fr in FIG. 10B indicates the resonant frequency of the partial circuit C. The partial circuit C of the filter 10 does not have an anti-resonant frequency due to the fact that the resonant circuit 11 does not have an anti-resonant point.

Therefore, in contrast to the partial circuit C of the filter 90, there is no need to dispose the anti-resonant frequency fa outside the band of the high band HB and the arrangement of the resonant frequency fr is not restricted. For example, as illustrated in part (a) of FIG. 10B, the resonant frequency fr may be disposed outside the band of the high band HB and a region in which variations in return loss are small may be disposed inside the band of the high band HB.

The arranging of a region in which variations in return loss are small inside the band of the high band HB is also facilitated by the fact that variations in the frequency characteristics of the LC resonant circuit are gentle compared with those of an elastic wave resonator.

Figure 10C:
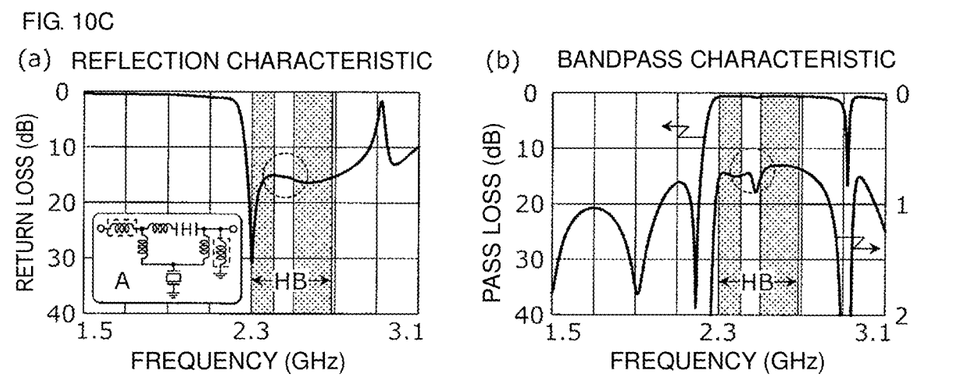
FIG. 10C is a graph illustrating an example of a reflection characteristic and a bandpass characteristic of the entire filter according to the preferred embodiment 1 of the present invention.

FIG. 10C is a graph illustrating an example of the reflection characteristic and the bandpass characteristic of the entirety A of the filter 10, where part (a) illustrates the reflection characteristic and part (b) illustrates the bandpass characteristic.

As can be seen inside the broken line circle in part (a) of FIG. 10C, the return loss in the center of the high band HB is maintained as a good return loss. This is because the steepness of the reflection characteristic of the partial circuit C is gentle and satisfactory return loss is ensured in the center of the high band, and therefore, good matching is able to be obtained over the entire high band HB by the inductors 18 and 19.

As a result, as can be seen inside the broken line circle in part (b) of FIG. 10C, the insertion loss of the entirety A of the filter 10 has a waveform that does not include a large concave portion inside the high band HB and the insertion loss is reduced (improved) in the center of the high band HB.

Thus, according to the filter 10, as a result of using an LC series resonant circuit for the resonant circuit 11, matching is easily achieved inside the pass band, and consequently, insertion loss inside the pass band is able to be reduced (improved) compared with the filter 90, which includes an elastic wave resonator in the series arm. The steep attenuation characteristic at the low-frequency end of the pass band of the filter 10 is provided by utilizing the steep frequency characteristic of the elastic wave resonator disposed in the parallel arm, similar to as in the filter 90.

Thus, a filter is able to be obtained that includes a wide pass band, a small insertion loss, and a steep attenuation characteristic at an end of the pass band.

The configuration of the filter 10 described above is merely an example, and modifications and/or restrictions such as those described hereafter may be made to the filter 10, for example.

For example, serially connected capacitors 13 and 14 are preferably included in the resonant circuit 11 in the example in FIG. 7. As a result, variations in the overall capacitance value are able to be reduced or prevented by including serially connected capacitors that each have a large capacitance value. In contrast, the capacitors 13 and 14 may be replaced with a single capacitor. In this case, the number of circuit components is able to be reduced and reductions in size and cost are able to be achieved.

Furthermore, in the resonant circuit 11, the inductor 12 may preferably be defined by a multilayer chip inductor and the capacitors 13 and 14 may be defined by multilayer chip capacitors. As a result, the Q value of the inductor 12 is able to be increased and unwanted coupling between the capacitors 13 and 14, the ground, for example, is able to be reduced or prevented compared with the case in which the inductor 12 and the capacitors 13 and 14 are defined by patterned conductors inside a substrate. As a result, the insertion loss of the filter 10 is able to be further reduced.

Furthermore, the Q values of the inductors 15 and 16 may preferably be higher than the Q values of the matching inductors 18 and 19.

According to this configuration, since the inductors 15 and 16 have high Q values, the insertion loss is able to be reduced across a wide pass band while making the steepness of the attenuation characteristic at the low-frequency end of the pass band high.

The above description has been provided using the high band HB (or the first portion and the second portion included in the high band HB) as an example of the pass band of the filter 10, but the pass band of the filter 10 is not limited to the frequency band referred to as the high band HB. The filter 10 may be used as a filter in which the pass band is an arbitrary frequency band having a wide band width and for which there is another frequency band that is adjacent to the low-frequency side thereof with a small frequency gap therebetween.

Preferred Embodiment 2

A multiplexer according to a preferred embodiment 2 of the present invention will be described with reference to a triplexer including the filter of the preferred embodiment 1 as an example.

Figure 11:
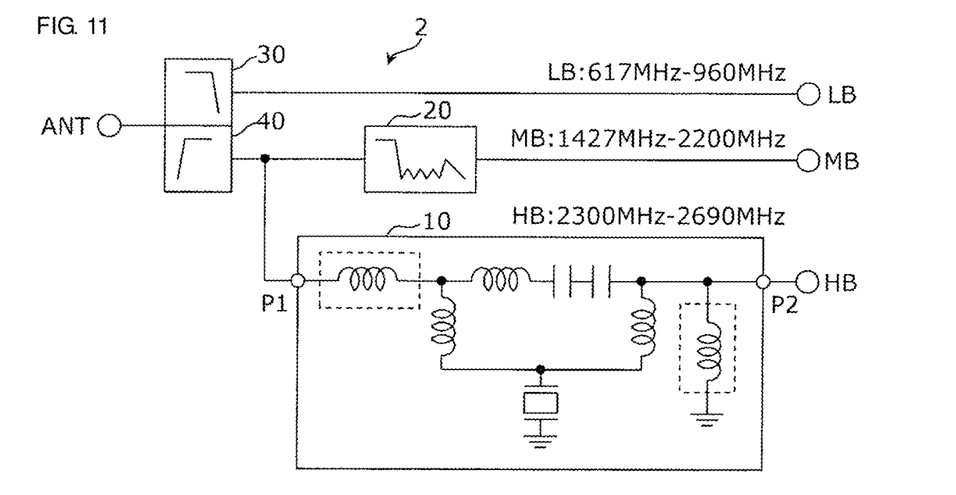
FIG. 11 is a block diagram illustrating an example of the configuration of a multiplexer according to a preferred embodiment 2 of the present invention.

FIG. 11 is a block diagram illustrating an example of the configuration of the multiplexer according to the preferred embodiment 2. As illustrated in FIG. 11, a multiplexer 2 includes filters 30 and 40 in addition to the filters 10 and 20 in the preferred embodiment 1. The multiplexer 2 is preferably a triplexer that multiplexes and demultiplexes signals of the pass bands of the filters 10, 20, and 30. The filters 10, 20, and 30 are examples of a first filter, a second filter, and a third filter, respectively.

In FIG. 11, the pass band of the filter 30 is preferably from about 617 MHz to about 960 MHz, as an example. In this specification, for convenience, the frequency band from about 617 MHz to about 960 MHz is referred to as a low band LB.

Preferably, the pass band of the filter 10 is the high band HB from about 2300 MHz to about 2690 MHz and the pass band of the filter 20 is the middle band MB from about 1427 MHz to about 2200 MHz, for example. The filter 40 has a pass band that is a combination of the high band HB and the middle band MB.

One end of the filter 30 and one end of the filter 40 are connected to an antenna terminal ANT. The other end of the filter 30 is connected to a low-band terminal LB. One end of the filter 10 and one end of the filter 20 are connected to the other end of the filter 40. The other end of the filter 10 is connected to a high band terminal HB and the other end of the filter 20 is connected to a middle band terminal MB.

The filter 20 preferably includes an LC resonant circuit and an elastic wave resonator (not illustrated), for example. An LC resonant circuit of the filter 20 provides a wide pass band for the middle band MB and a steep attenuation characteristic outside the pass band at the high-frequency side of the middle band MB.

The filter 30 preferably includes an LC resonant circuit, for example. The LC resonant circuit of the filter 30 provides a wide pass band for the low band LB.

Figure 12:
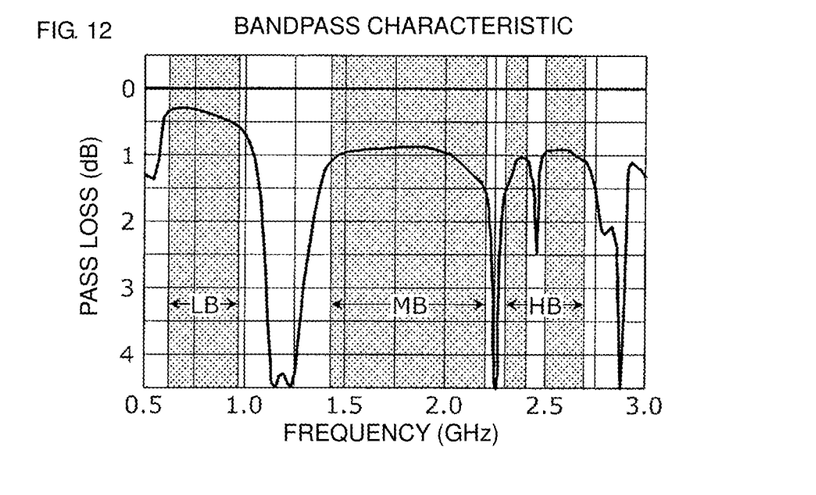
FIG. 12 is a graph illustrating an example of a bandpass characteristic of the multiplexer according to the preferred embodiment 2 of the present invention.

FIG. 12 is a graph illustrating an example of the bandpass characteristic of the multiplexer 2. In the filter 20 used for the middle band MB in the multiplexer 2, a steep attenuation characteristic is able to be provided at the high-frequency end of the pass band and a signal of the high band HB is able to be sufficiently stopped by utilizing the steep frequency characteristic of the elastic wave resonator. As a result of including the filters 10 and 20, a signal of the high band HB and a signal of the middle band MB are completely isolated from each other and, therefore, both signals are able to be simultaneously transmitted and received using a single antenna. Consequently, carrier aggregation communication using the combination of a communication band included in the high band HB and a communication band included in the middle band MB is able to be performed using a single antenna.

The high band HB, the middle band MB, and the low band LB have been used as examples of frequency bands in the above description, but allocation of frequency bands that are higher than the high band HB has also been progressing recently. For example, the 5G band from about 5150 MHz to about 5925 MHz may be provided as an example of a frequency band that is higher than the high band HB.

The filter 10 is also suitable for use as a high band HB filter in a multiplexer that multiplexes and demultiplexes signals of the high band HB and the 5G band, for example.

Figure 13:
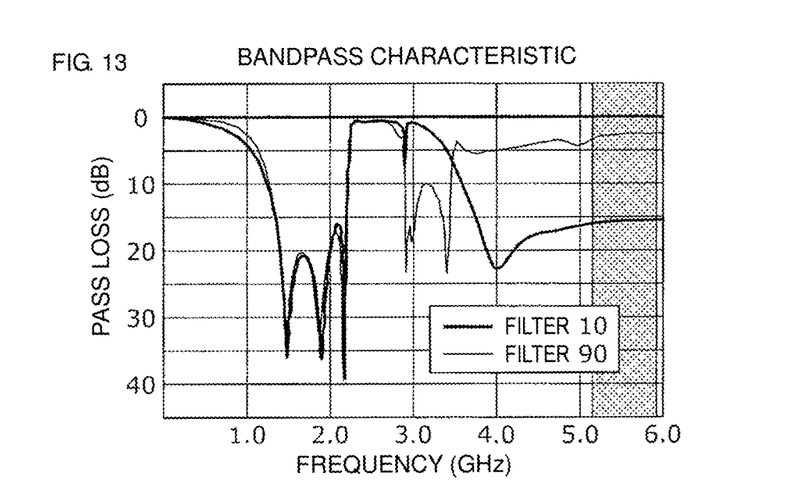
FIG. 13 is a graph illustrating an example of a wide-area bandpass characteristic of the filter according to the preferred embodiment 2 of the present invention.

FIG. 13 is a graph illustrating an example of a wide-area bandpass characteristic of the filter 10 and illustrates pass loss at about 6 GHz and below. In FIG. 13, to enable a comparison, the wide-area pass loss of the filter 90 is illustrated along with the pass loss of the filter 10. In addition, the 5G band is illustrated in gray.

As can be seen in FIG. 13, there is almost no attenuation in the 5G band in the bandpass characteristic of the filter 90. Therefore, in the case in which the filter 90 is used as the high band HB filter of a multiplexer that multiplexes and demultiplexes signals of the high band HB and the 5G band, it is necessary to separately provide an attenuation circuit for the 5G band. Regarding this point, since the 5G band is attenuated in the filter 10, there is no need to provide an 5G band attenuation circuit if the filter 10 is used.

Although filters and multiplexers according to preferred embodiments of the present invention have been described above, the present invention is not limited to these preferred embodiments. Various modifications, as conceived by a person skilled in the art, made to the preferred embodiments and other preferred embodiments provided by combining elements of different preferred embodiments may be included in the scope of the present invention as long as they do not depart from the spirit of the present invention.

A filter according to a preferred embodiment of the present invention includes a series arm resonant circuit that defines at least a portion of a signal path connected between a first terminal and a second terminal, a parallel arm resonator including one end that is grounded, a first inductor including one end that is connected to one end of the series arm resonant circuit and another end that is connected to another end of the parallel arm resonator, and a second inductor including one end that is connected to another end of the series arm resonant circuit and another end that is connected to the other end of the parallel arm resonator. The series arm resonant circuit is an LC series resonant circuit in which a third inductor and a capacitor are connected in series with each other.

According to this configuration, by making use of the fact that the LC series resonant circuit defining the series arm resonant circuit does not have an anti-resonant frequency and the fact that changes in the resonance characteristic of the LC series resonant circuit are gentle compared with an elastic wave resonator, matching inside a wide pass band is able to be improved and the insertion loss of the filter is able to be reduced. Furthermore, a steep attenuation characteristic is able to be provided at an end of the pass band by utilizing the frequency characteristic of the parallel arm resonator in which the impedance falls sharply in the vicinity of the resonant frequency. As a result, a filter is able to be obtained that has a wide pass band, a small insertion loss, and a steep attenuation characteristic at an end of the pass band.

In addition, the parallel arm resonator may include a substrate made of a piezoelectric material containing lithium niobate and a signal may be transmitted in the parallel arm resonator via Rayleigh waves that propagate along the substrate.

Regarding this configuration, it is known that the frequency characteristic of an elastic wave resonator that includes a substrate made of a piezoelectric material containing lithium niobate and in which a signal is transmitted via Rayleigh waves that propagate along the substrate (abbreviated to LN Rayleigh wave resonator) has particularly high steepness. Therefore, a steep attenuation characteristic is able to be provided at the low-frequency end of the pass band of the filter by configuring the parallel arm resonator as an LN Rayleigh resonator.

Furthermore, in the series arm resonant circuit, the third inductor may be defined by a multilayer chip inductor and the capacitor may be defined by a multilayer chip capacitor.

In this configuration, the third inductor and the capacitor are defined by multilayer chip components. As a result, the Q value of the third inductor is able to be increased and unwanted coupling between the capacitor, the ground, and other elements is able to be reduced or prevented compared with the case in which the third inductor and the capacitor are defined by patterned conductors inside a substrate. As a result, the insertion loss of the filter is able to be further reduced.

In addition, the capacitor may be defined by a plurality of multilayer chip capacitors that are connected in series with each other.

According to this configuration, variations in the overall capacitance value of the capacitor are reduced or prevented by using a plurality of multilayer chip capacitors that each have a large capacitance value, and therefore a filter having small variations in characteristics is achieved.

Furthermore, the filter may include a matching fourth inductor that is connected to at least one portion of the signal path out of a portion of the signal path between the series arm resonant circuit and the first terminal and a portion of the signal path between the series arm resonant circuit and the second terminal, and a Q value of the first inductor and a Q value of the second inductor may both be higher than a Q value of the fourth inductor in a pass band of the filter.

According to this configuration, since the first inductor and the second inductor have high Q values, the insertion loss is able to be reduced across a wide pass band while making the steepness of the attenuation characteristic high at the low-frequency end of the pass band.

In addition, the filter may have a pass band from about 2300 MHz to about 2400 MHz and from about 2496 MHz to about 2690 MHz and may have a stop band from about 1427 MHz to about 2200 MHz.

With this configuration, a filter is able to be obtained in which a pass band and a stop band thereof are respectively the high band and the middle band described in this specification. This filter is suitable for use as a high-band filter of a multiplexer that multiplexes and demultiplexes signals of a high band and a middle band.

In addition, a multiplexer according to a preferred embodiment of the present invention includes a first filter defined by the above-described filter; a second filter including a pass band from about 1427 MHz to about 2200 MHz; and a third filter including a pass band from about 617 MHz to about 960 MHz. One end of the first filter, one end of the second filter, and one end of the third filter are connected to each other.

According to this configuration, a multiplexer is able to be obtained that multiplexes and demultiplexes signal of three frequency bands, where the low band described in this specification has been added to the above-described high band and middle band.

In addition, the second filter may include an LC resonant circuit and an elastic wave resonator and the third filter may include an LC resonant circuit.

According to this configuration, in the second filter for the middle band, a steep attenuation characteristic is able to be provided at the high-frequency end of the pass band by utilizing the steep frequency characteristic of the elastic wave resonator. As a result of using the first filter and the second filter, a high-band signal and a middle-band signal are completely isolated from each other in terms of frequency and both signals are able to be simultaneously transmitted and received using a single antenna. Consequently, carrier aggregation communication using the combination of a communication band included in the high band and a communication band included in the middle band is able to be performed using a single antenna.

Preferred embodiments of the present invention may be widely used in communication devices, such as cellular phones, as a filter, and a multiplexer, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter comprising:
a series arm resonant circuit defining at least a portion of a signal path connected between a first terminal and a second terminal;
a parallel arm resonator including one end that is grounded;
a first inductor including one end connected to one end of the series arm resonant circuit and another end connected to another end of the parallel arm resonator;
a second inductor including one end connected to another end of the series arm resonant circuit and another end connected to the another end of the parallel arm resonator; and
a matching fourth inductor connected to at least one of a portion of the signal path between the series arm resonant circuit and the first terminal and a portion of the signal path between the series arm resonant circuit and the second terminal; wherein
the series arm resonant circuit is an LC series resonant circuit in which a third inductor and a capacitor are connected in series with each other; and
a Q value of the first inductor and a Q value of the second inductor are both higher than a Q value of the fourth inductor in a pass band of the filter.

2. The filter according to claim 1, wherein the parallel arm resonator includes a substrate made of a piezoelectric material containing lithium niobate, and a signal is transmitted in the parallel arm resonator via Rayleigh waves that propagate along the substrate.

3. The filter according to claim 1, wherein, in the series arm resonant circuit, the third inductor is defined by a multilayer chip inductor and the capacitor is defined by a multilayer chip capacitor.

4. The filter according to claim 1, wherein the capacitor is defined by a plurality of multilayer chip capacitors connected in series with each other.

5. The filter according to claim 1, wherein the filter has a pass band from about 2300 MHz to about 2400 MHz and from about 2496 MHz to about 2690 MHz and has a stop band from about 1427 MHz to about 2200 MHz.

6. A multiplexer comprising:
a first filter defined by the filter according to claim 5;
a second filter having a pass band from about 1427 MHz to about 2200 MHz; and
a third filter having a pass band from about 617 MHz to about 960 MHz; wherein
one end of the first filter, one end of the second filter, and one end of the third filter are connected to each other.

7. The multiplexer according to claim 6, wherein
the second filter includes an LC resonant circuit and an elastic wave resonator; and
the third filter includes an LC resonant circuit.

8. The multiplexer according to claim 6, wherein the parallel arm resonator includes a substrate made of a piezoelectric material containing lithium niobate, and a signal is transmitted in the parallel arm resonator via Rayleigh waves that propagate along the substrate.

9. The multiplexer according to claim 6, wherein, in the series arm resonant circuit, the third inductor is defined by a multilayer chip inductor and the capacitor is defined by a multilayer chip capacitor.

10. The multiplexer according to claim 6, wherein the capacitor is defined by a plurality of multilayer chip capacitors connected in series with each other.

11. A multiplexer comprising:
a first filter defined by the filter according to claim 1;
a second filter; wherein
one end of the first filter and one end of the second filter are connected to each other.

12. The multiplexer according to claim 11, wherein the second filter includes an LC resonant circuit and an elastic wave resonator.

13. The multiplexer according to claim 11, wherein the parallel arm resonator includes a substrate made of a piezoelectric material containing lithium niobate, and a signal is transmitted in the parallel arm resonator via Rayleigh waves that propagate along the substrate.

14. The multiplexer according to claim 11, wherein, in the series arm resonant circuit, the third inductor is defined by a multilayer chip inductor and the capacitor is defined by a multilayer chip capacitor.

15. The multiplexer according to claim 11, wherein the capacitor is defined by a plurality of multilayer chip capacitors connected in series with each other.

16. The multiplexer according to claim 11, wherein the filter has a pass band from about 2300 MHz to about 2400 MHz and from about 2496 MHz to about 2690 MHz and has a stop band from about 1427 MHz to about 2200 MHz.

17. The multiplexer according to claim 11, wherein the second filter has a pass band from about 1427 MHz to about 2200 MHz.

* * * * *